(12) United States Patent
Kim et al.

(10) Patent No.: US 7,536,623 B2
(45) Date of Patent: May 19, 2009

(54) METHOD AND APPARATUS FOR GENERATING A LOW-DENSITY PARITY CHECK CODE

(75) Inventors: Sang-Hyo Kim, Suwon-si (KR); Han-Ju Kim, Seoul (KR); Min-Goo Kim, Yongin-si (KR); Young-Mo Gu, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 553 days.

(21) Appl. No.: 11/289,300

(22) Filed: Nov. 30, 2005

(65) Prior Publication Data

US 2006/0156183 A1 Jul. 13, 2006

(30) Foreign Application Priority Data

Dec. 1, 2004 (KR) ...................... 10-2004-0100039

(51) Int. Cl.
*H03M 13/13* (2006.01)
(52) U.S. Cl. ...................................................... 714/752
(58) Field of Classification Search .................. 714/752
See application file for complete search history.

(56) References Cited

U.S. PATENT DOCUMENTS

| | | | | |
|---|---|---|---|---|
| 6,567,465 B2 * | 5/2003 | Goldstein et al. | ........... | 375/222 |
| 6,633,856 B2 * | 10/2003 | Richardson et al. | ........... | 706/15 |
| 6,948,109 B2 * | 9/2005 | Coe | ............. | 714/752 |
| 7,000,168 B2 * | 2/2006 | Kurtas et al. | ................ | 714/755 |
| 7,178,082 B2 * | 2/2007 | Yu et al. | ...................... | 714/752 |
| 7,260,763 B2 * | 8/2007 | Sukhobok et al. | ........... | 714/758 |
| 7,313,752 B2 * | 12/2007 | Kyung et al. | ................. | 714/801 |
| 2004/0093549 A1 | 5/2004 | Song et al. | | |
| 2004/0153934 A1 | 8/2004 | Jin et al. | | |

FOREIGN PATENT DOCUMENTS

EP 1 596 501 11/2005

(Continued)

OTHER PUBLICATIONS

Tanner, R. Michael et al., "LDPC Block and Convolutional Codes Based on Circulant Matrices," *IEEE Transactions of Information Theory*, vol. 50, No. 12, pp. 2966-2984, XP-002368048, Dec. 2004.

(Continued)

*Primary Examiner*—Stephen M Baker
(74) *Attorney, Agent, or Firm*—Roylance, Abrams, Berdo & Goodman, LLP (57) ABSTRACT

A low density parity check (LDPC) code generating method and apparatus are provided. A parity check matrix with (N−K) rows for check nodes and N columns for variable nodes are formed to encode an information sequence of length K to a codeword of length N. The parity check matrix is divided into an information part matrix with K columns and a parity part matrix with (N−k) columns. The parity part is divided into P×P subblocks. P is a divisor of (N−K). First and second diagonals are defined in the parity part matrix and the second diagonal is a shift of the first diagonal by f subblocks. Shifted identity matrices are placed on the first and second diagonals and zero matrices are filled elsewhere. An odd number of delta matrices each having only one element of 1 are placed in one subblock column of the parity part matrix. The parity check matrix is stored.

17 Claims, 11 Drawing Sheets

FOREIGN PATENT DOCUMENTS

JP    2001-168733    6/2001

OTHER PUBLICATIONS

Olgica Milenkovic et al., "Block-Circulant Low-Density Parity Check Codes for Optical Communication Systems," *IEEE Journal of Selected Topics in Quantum Electronics*, vol. 10, No. 2, pp. 294-299, XP-002368049, Mar./Apr. 2004.

David J.C. MacKay et al., "Comparison of Constructions of Irregular Gallager Codes," *IEEE Transactions on Communications*, vol. 47, No. 10, pp. 1449-1454, XP-002368050, Oct. 1999.

* cited by examiner $$H = \begin{bmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{bmatrix}$$

METHOD AND APPARATUS FOR GENERATING A LOW-DENSITY PARITY CHECK CODE

PRIORITY

This application claims the benefit under 35 U.S.C. § 119(a) to an application entitled "Method and Apparatus for Generating Low-Density Parity Check Code" filed in the Korean Intellectual Property Office on Dec. 1, 2004 and assigned Serial No. 2004-100039, the entire contents of which are incorporated hereby by reference.

BACKGROUND OF THE INVENTION

1. Field of the Invention

The present invention relates generally to data coding. In particular, the present invention relates to a method and apparatus for generating a low-density parity check (LDPC) code.

2. Description of the Related Art

In general, communication systems encode transmission data prior to transmission to increase transmission stability, avoiding retransmissions and increasing transmission efficiency. For this purpose, they use convolutional coding, turbo coding, etc.

The rapid development of wireless communication technology has driven the appearance of wireless communication systems that can transmit data at very high rates. For higher-rate data transmission, they need coding techniques that offer higher efficiency than the above existing coding methods.

In this context, LDPC codes have emerged as a promising coding method. The LDPC codes were first proposed by Gallager in the early 1960's and re-discovered by MacKay after the 1990's. MacKay's LDPC code is based on decoding using the sum-product algorithm. Using belief propagation, these LDPC codes have attracted attention as a code having excellent performance that approaches the Shannon capacity limit.

Richardson and Chung et al. later proposed density evolution. The basic idea of the density evolution is to track the probability distributions of messages generated and updated during decoding, which change according to the number of iterations, on a factor graph describing a LDPC code. Under the assumption of the density evolution and infinite iterations on the factor graph, a channel parameter was detected which converges the probability of error to "0". That is, the degree distributions of variable nodes and check nodes, which maximize the channel parameter on the factor graph, were proposed. They theoretically demonstrated that this case is also applicable to LDPC codes of a finite length with cycles. With this density evolution technique, the channel capacity of irregular LDPC codes approaches to within 0.0045 dB of the theoretical Shannon limit.

These LDPC codes are discussed as a prominent alternative to turbo codes for future-generation mobile communication systems. This is because the LDPC codes have parallel structure and low complexity in the design of a decoder, low error-floor performance, and good frame error rate. Accordingly, it is expected that excellent LDPC codes will be proposed with more developmental efforts over the coming years.

Distinctive shortcomings with conventional LDPC codes, however, are greater complexity in terms of coding relative to turbo coding, difficulty in deciding an optimum code structure that offers better performance than turbo codes, for a short frame size, and require a large memory for LDPC code representation. Therefore, a need exists for an efficient LDPC code having flexibility in frame length.

SUMMARY OF THE INVENTION

An object of the present invention is to substantially solve at least the above problems and/or disadvantages and to provide at least the advantages below. Accordingly, an object of the present invention is to provide a method and apparatus for generating a low density parity check (LDPC) code which can be implemented with simple coding.

Another object of the present invention is to provide a method and apparatus for generating a block LDPC code which can be implemented with simple coding.

The above objects are achieved by providing a LDPC code generating method and apparatus.

According to one aspect of the present invention, in a method of generating a LDPC code, a parity check matrix is formed which has (N−K) rows for check nodes and N columns for variable nodes to encode an information sequence of length K to a codeword of length N. The parity check matrix is divided into an information part matrix having K columns and a parity part matrix having (N−k) columns. The parity part matrix is divided into P×P subblocks. P is a divisor of (N−K). A first diagonal and a second diagonal are defined in the parity part matrix such that the second diagonal is a shift of the first diagonal by f subblocks. Shifted identity matrices with shift indexes are laced in subblocks that lie on the first and second diagonals. Zero matrices are filled in the remaining subblocks other than the subblocks of the first and second diagonals. An odd number of delta matrices are placed in one subblock column of the parity part matrix. Each delta matrix comprises one element of 1 and the other elements of 0. The parity check matrix is stored.

BRIEF DESCRIPTION OF THE DRAWINGS

The above and other objects, features and advantages of the present invention will become more apparent from the following detailed description when taken in conjunction with the accompanying drawings in which.

Throughout the drawings, the same or similar elements, features and structures are represented by the same reference numerals.

DETAILED DESCRIPTION OF EXEMPLARY EMBODIMENTS

Embodiments of the present invention will be described herein below with reference to the accompanying drawings. In the following description, well-known functions or constructions are not described in detail for conciseness.

Low density parity check (LDPC) codes are a class of linear block codes. The structure of a LDPC code is defined by a parity check matrix containing 0s at most entries and 1s elsewhere. For instance, an (N, K) LDPC code for K information bits is a linear block code with a block size of N, defined by a sparse (N−K)×N parity check matrix in which all elements other than 1s are 0s. The number of 1s in a row or a column is called the degree of the row or the column.

A LDPC code is regular when each row and each column of the parity check matrix has a constant degree and irregular otherwise. It is generally known that the irregular LDPC code outperforms the regular one. Due to different degrees among rows and among columns, however, the irregular LDPC code promises excellent performance only if the row degrees and the column degrees are appropriately adjusted.

A codeword of length N is represented as a vector C and for information bits of length K, an (N, K) code with $2^K$ codewords is used. The (N, K) LDPC code is defined by an (N−K)×N parity check matrix H, satisfying $$HC^T=0 \quad (1)$$

Figure 1:
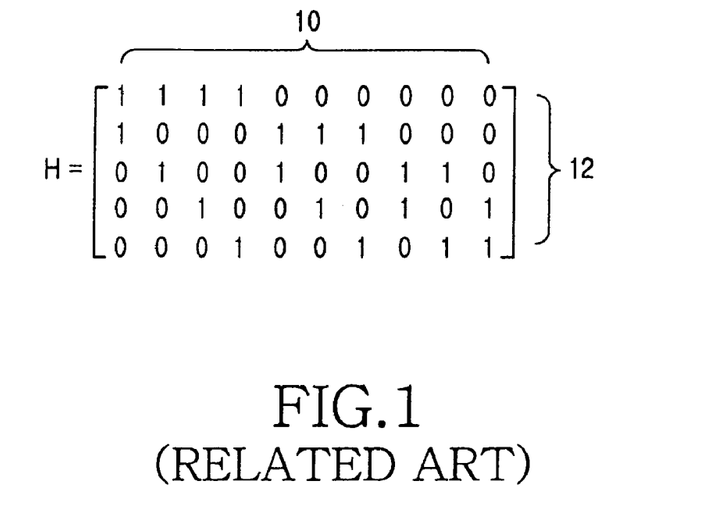
FIG. 1 illustrates a parity check matrix that defines a conventional (10, 5) low density parity check (LDPC) code.

FIG. 1 illustrates a parity check matrix that defines a conventional (10, 5) LDPC code.

Referring to FIG. 1, the parity check matrix H for the LDPC code is comprised of 5 rows and 10 columns. The columns have a uniform degree of 2 and the rows have a uniform degree of 4. Thus, the (10, 5) LDPC code is regular.

Figure 2:
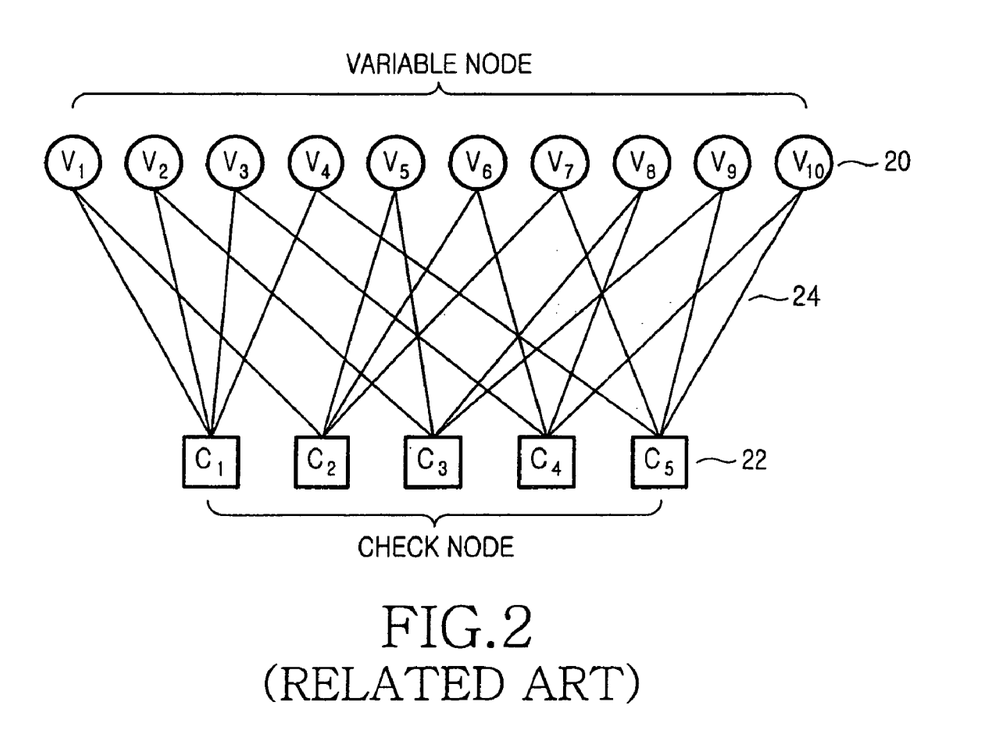
FIG. 2 illustrates a factor graph describing the LDPC code illustrated in FIG. 1.

FIG. 2 illustrates a factor graph describing the LDPC code illustrated in FIG. 1.

Referring to FIG. 2, the factor graph of the LDPC code contains 10 variable nodes 20, represented by $V_1$ to $V_{10}$ and 5 check nodes 22, represented by $C_1$ to $C_5$. When an element in an $i^{th}$ row and a $j^{th}$ column of the parity check matrix is 1, an edge (or branch) 24 connects an $i^{th}$ variable node, $V_i$ with a $j^{th}$ check node, $C_j$.

As described above, because the parity check matrix of the LDPC code has a very small degree, message passing iterative decoding using the sum-product algorithm is available for a relatively long block code. As the block size of the block code is continually increased, it has performance close to the Shannon channel capacity limit, like turbo codes.

LDPC decoding is the process of iteratively exchanging messages generated and updated at individual nodes between the variable nodes and the check nodes on the factor graph. In the operation, the nodes update the messages using the sum-product algorithm. This iterative LDPC decoding is depicted in FIGS. 3A and 3B.

Figure 3A:
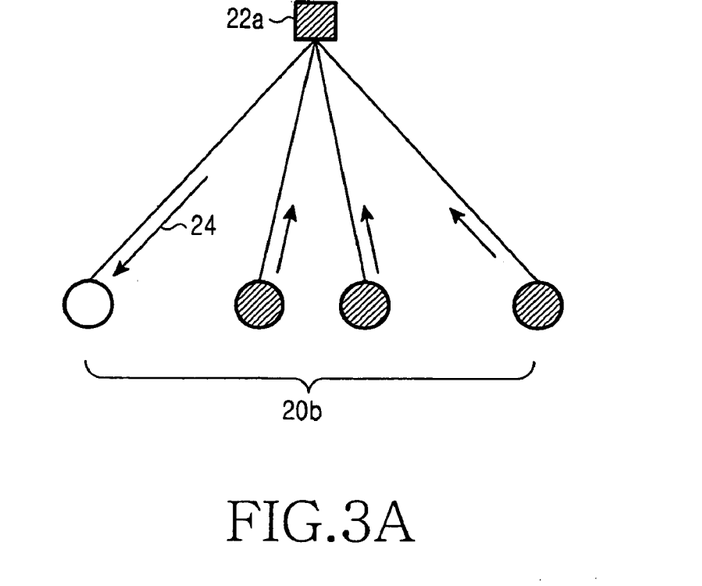
FIGS. 3A and 3B are conceptual views of LDPC decoding.
Figure 3B:
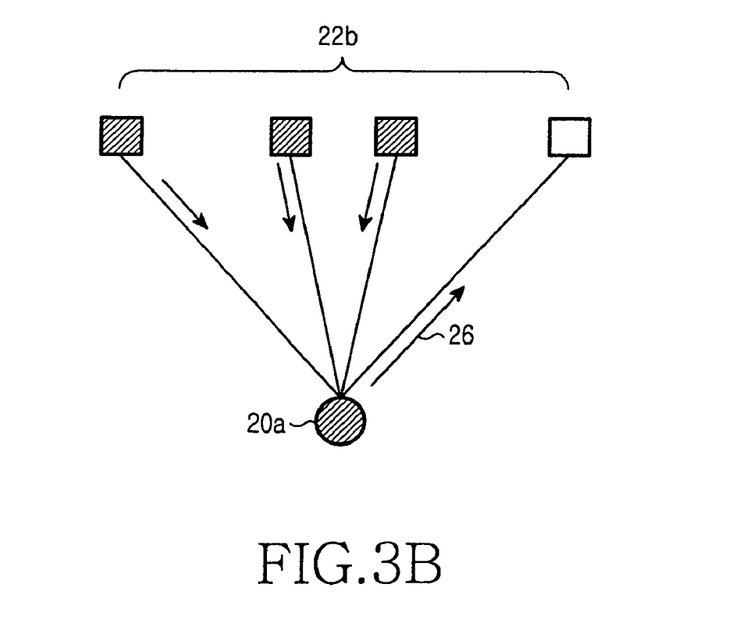

Referring to FIG. 3A, a check node 22a creates a check node message 24 for one of variable nodes 20b connected to the check node 22a by summing variable node values received from the other variable nodes 20b. Referring to FIG. 3B, a variable node 20a creates a variable node message 26 for one of check nodes 22b connected to the variable node 20a by multiplying check node values received from the other check nodes 22b.

In application of the sum-product algorithm, check node messages and variable node messages are transferred along the edges connecting between them. Thus, as the parity check matrix has less 1s, the number of messages to be delivered decreases, thereby reducing the computation volume and memory space for decoding.

Efficient LDPC coding is an active research area. In general, a parity sequence $C_P$ containing (N−K) parity bits is generated using an information sequence of length K, $C_I$ and an (N−K)×N parity check matrix. This parity check matrix is a concatenation of an (N−K)×K information part matrix $H_1$ and an (N−K)×(N−K) parity check matrix $H_P$, expressed as $$H=[H_I:H_P] \quad (2)$$

Here, $C=[C_I:C_P]$ where $C_I=[c_0, c_1, \ldots, c_{K-1}]$ and $C_P=[p_0, p_1, \ldots, p_{N-K-1}]$.

The information part of the parity check matrix is designed, taking into account the cycle and density evolution characteristics of the LDPC code, which is beyond the scope of the present invention. Therefore, it will not be described in detail herein.

Figure 4:
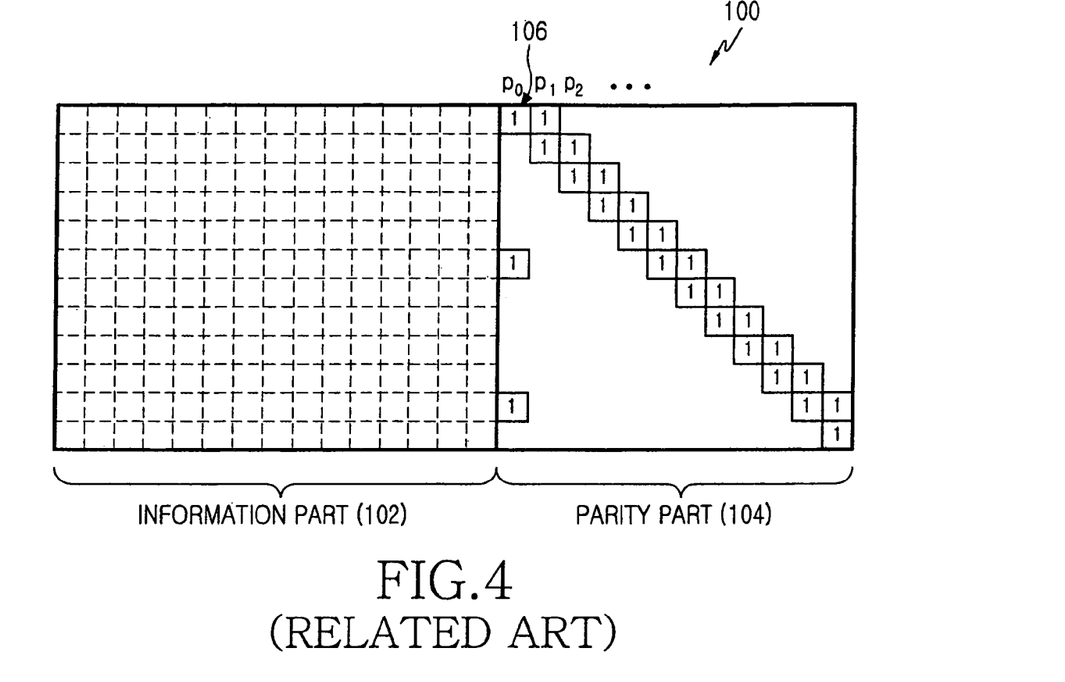
FIG. 4 illustrates an exemplary parity check matrix for efficient LDPC coding.

FIG. 4 illustrates an exemplary parity check matrix for efficient LDPC coding.

Referring to FIG. 4, a parity check matrix 100 is divided into an information part 102 and a parity part 104. Elements of 1 lie on a first diagonal which starts with the element in the first row and the first column and ends with the element in the last row and the last column of the parity part 104 being a square matrix. A second diagonal, which starts with the element in the first row and the second column, also has elements of 1. Here, it can be said that the second diagonal is a cyclic shift of the first diagonal by 1.

The parity check matrix 100 is designed to comprise an odd number of 1s in a first row 106, to thereby sequentially generate parity bits, eliminating columns having a degree of 1. The elements other than 1s explicitly shown in FIG. 4 are all 0s.

Summing all rows of the parity check matrix 100 column by column results a vector $S=[S_I:S_P]$. It is obvious from Eq. (1) that the inner product between the vector S and the codeword vector C must be 0. It is to be appreciated herein that addition indicates addition over a Galois Field in an embodiment of the present invention. Since variable nodes corresponding to the remaining parity bits except for the first parity bit in the parity part 104 have a degree of 2 all the time, $S_P$ is all 0s except the first bit, that is, $S_P=[1, 0, 0, \ldots, 0]$. Therefore, Eq. (3) is derived from Eq. (1) and the first parity bit $p_0$ is computed by $$SC^T=p_0+S_I^T=0 \quad (3)$$

If each row of the parity check matrix 100 is expressed as $$h_i=[h_i^I:h_i^P] \quad (4)$$

then, $$h_jC^T=0 \quad (5)$$

where j is an integer between 0 and (N−K−1).

Thus, $p_1$ is computed by $$h_0^T C_I^T + p_0 + p_1 = 0 \quad (6)$$

In this manner, the parity bits are sequentially obtained.

First, $h_j^I C_I^T$ is calculated for every row, and then a $(z+1)^{th}$ parity bit is calculated in the following manner, while accumulating the obtained values. Let a $z^{th}$ element of $h_j^P$ be denoted by $h_j^P(z)$ and the vector g of the first column of $H_P$ be represented as $$g = [h_0^P(0), h_1^P(0), \ldots, h_{N-K-1}^P(0)] \quad (7)$$

Then, $$p_{z+1} = \sum_{i=0}^{z} (h_z^I C_I^T + p_0 h_z^P(0)) \quad (8)$$

It is possible to expand the parity part 104 to a P-times larger parity part by substituting each element of '1' into a P×P identity matrix I in the parity check matrix 100. Obviously, P is a divisor of (N−K). A block-type LDPC code with the expanded parity part advantageously can be represented with a smaller memory capacity, has flexibility in frame length, and enables simple decoder implementation, relative to an irregular LDPC code. The block-type LDPC code is called interchangeably with a vector LDPC code, a block LDPC code, or a GDM LDPC code.

Like array codes, the parity check matrix of the GDM LDPC code has matrices created by cyclically shifting the rows of the P×P identity matrix I by 's', as subblocks. 's' is a shift index.

Figure 5:
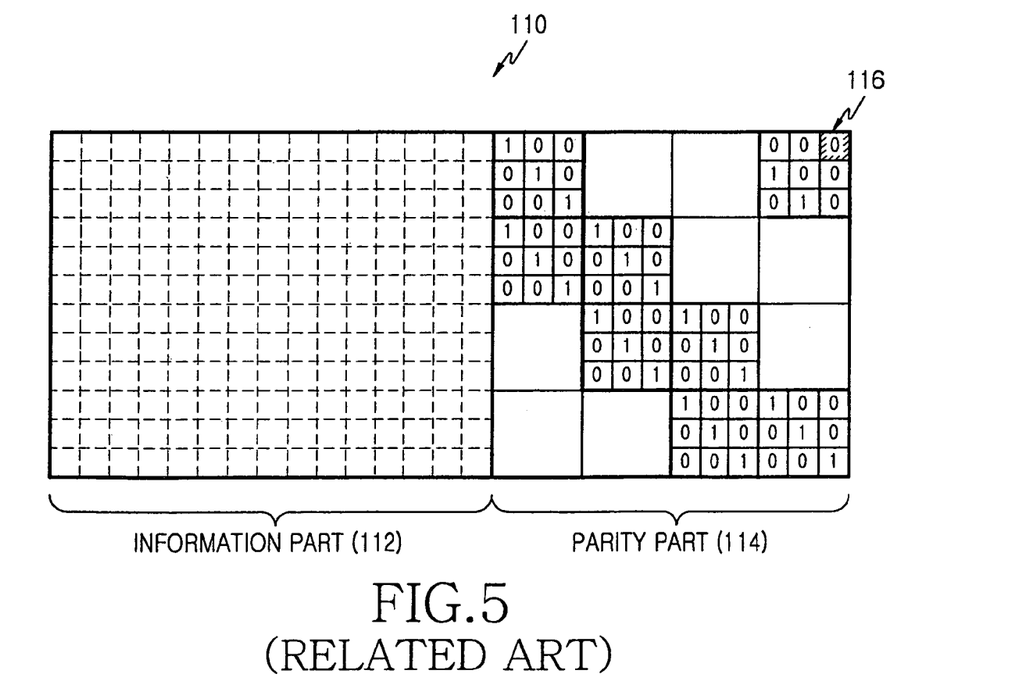
FIG. 5 illustrates a block parity check matrix that defines a generalized dual-diagonal (GDM) LDPC code.

With reference to FIG. 5, a block parity check matrix describing a GDM LDPC code will be described below. A (27, 15) GDM LDPC code is taken as an example.

Referring to FIG. 5, if n is defined as N/P and k is defined as K/P, P=3, n=9 and k=5 for a parity check matrix 110. The parity check matrix 110 is divided into an information part 112 and a parity part 114. The parity part 114 is divided into subblocks each being a 3×3 matrix. Therefore, the parity part 114 has 4 subblock rows and 4 subblock columns. While not shown, the information part 112 comprises only zero matrices or shifted identity matrices, and the positions of the non-zero subblocks and the shift index s of the shifted identity matrices are determined by taking into account the density evolution and cycle characteristics of the code.

Shifted identity matrices are placed on a first diagonal starting with the first subblock row and the first subblock column and ending with the last subblock row and the last subblock column. One thing to note is that one 116 of the shifted identity matrices on the first diagonal in the parity part 114 has a 1 punctured. A second diagonal starting with the first subblock row and the second subblock column has also shifted identity matrices. Thus, it can be said that the second diagonal is a cyclic shift of the first diagonal by 1. The empty subblocks in the parity part 114 are zero matrices.

The shifted identity matrices are matrices shifted from the identity matrix I diagonally. An example of such a shifted identity matrix is given as $$\sigma = \begin{bmatrix} 0 & 1 & 0 & 0 \\ 0 & 0 & 1 & 0 \\ 0 & 0 & 0 & 1 \\ 1 & 0 & 0 & 0 \end{bmatrix} \quad (9)$$

A shifted identity matrix $\sigma^s$ with shift index s indicates a matrix shifted from the identity matrix I by s times. Hence, $\sigma^0 = I$. The diagonals in the parity part 114 illustrated in FIG. 5 have $\sigma^s$ subblocks. The shifted identity matrix is a cyclic permutation matrix created by cyclically shifting every column of the identity matrix I.

Figure 6:
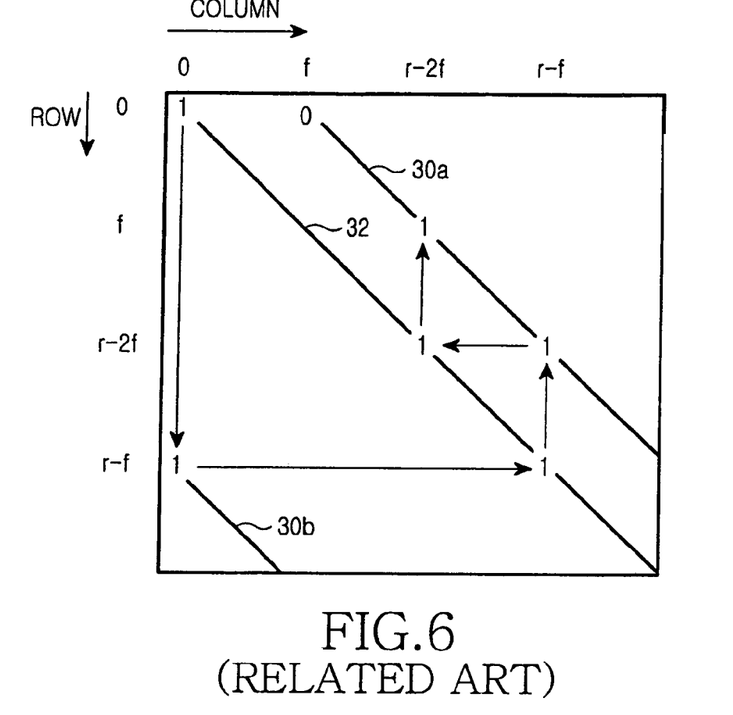
FIG. 6 illustrates the parity part of a base parity check matrix for generating the GDM LDPC code and the associated GDM LDPC coding.

A GDM LDPC code is created using the parity part of the parity check matrix illustrated in FIG. 6. In FIG. 6, only is lie on diagonal lines 30a, 30b and 32 in the illustrated binary matrix. The dual-diagonal matrix is so configured that the second diagonals 30a and 30b is a shift of the first diagonal 32 by 'f'. Placing 0 as the first entry of the second diagonal 30a (i.e. puncturing) enables coding of $p_0$ and the remaining parity bits are sequentially encoded in a similar manner to the parity check matrix 100 illustrated in FIG. 4. All other parity bits are sequentially encoded in arrowed directions, starting from p0. Here, r=n−k=(N−K)/P.

Figure 7:
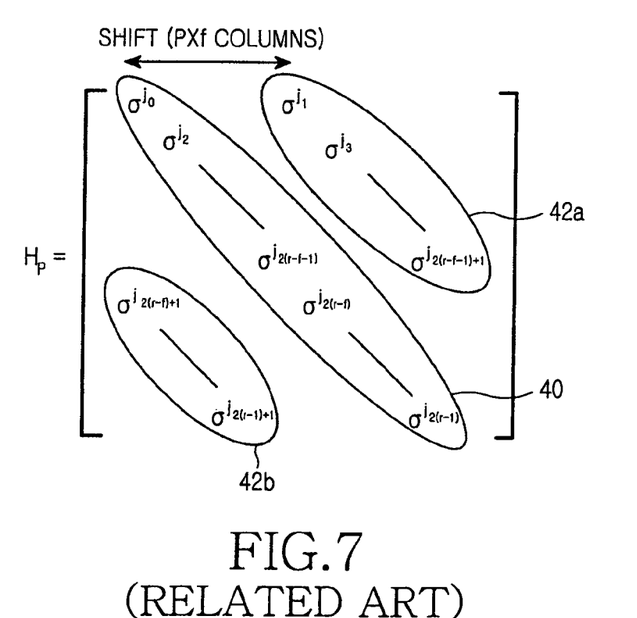
FIG. 7 illustrates a block parity part expanded from the parity part illustrated in FIG. 6.

FIG. 7 illustrates a block parity part expanded from the parity part illustrated in FIG. 6.

Referring to FIG. 7, the illustrated parity part comprises shifted identity matrices $\sigma^j$ on first and second diagonals 40, 42a and 42b and zero matrices elsewhere. Shifted identity matrices with shift indexes 0, 2, ..., 2(r−f−1), 2(r−f), 2(r−1) lie on the first diagonal 40. The second diagonals 42a and 42b, which are a shift of the first diagonal 40 by f subblocks, have shifted identity matrices with shift indexes 1, 3, ..., 2(r−f−1)+1, ... 2(r−f)+1, ... 2(r−1)+1. Every shifted identity matrix is of size P×P and thus the second diagonal 42a is apart from the first diagonal 40 by P×f columns.

In the parity part, if 1s in the first row of the first shifted identity matrix $\sigma^{j_1}$ on the first diagonal is changed to 0s instead of replacing the first shifted identity matrix $\sigma^{j_1}$ by a zero matrix, all parity bits can be encoded by circulating the entire non-zero elements.

Returning to FIG. 5, the parity part 114 is designed by applying the block shift f=3 to the parity part illustrated in FIG. 7. Even though it is set that $j_0 = j_1 = 0$ and the first row of the subblock 116 $\sigma^{j_0}$ is rendered to have all 0s through permutation of the parity bits, the nature inherent to the parity check matrix is not lost.

The shift index $j_i$ of each subblock is determined such that all parity bits can be sequentially encoded. To be more specific, $j_i$ is determined so that the sum modulo P of the shift indexes of the matrices on the two diagonals is prime with P, by $$gcd\left(\sum_i j_i, P\right) = 1 \quad (10)$$

where gcd denotes a great common divisor.

Figure 8:
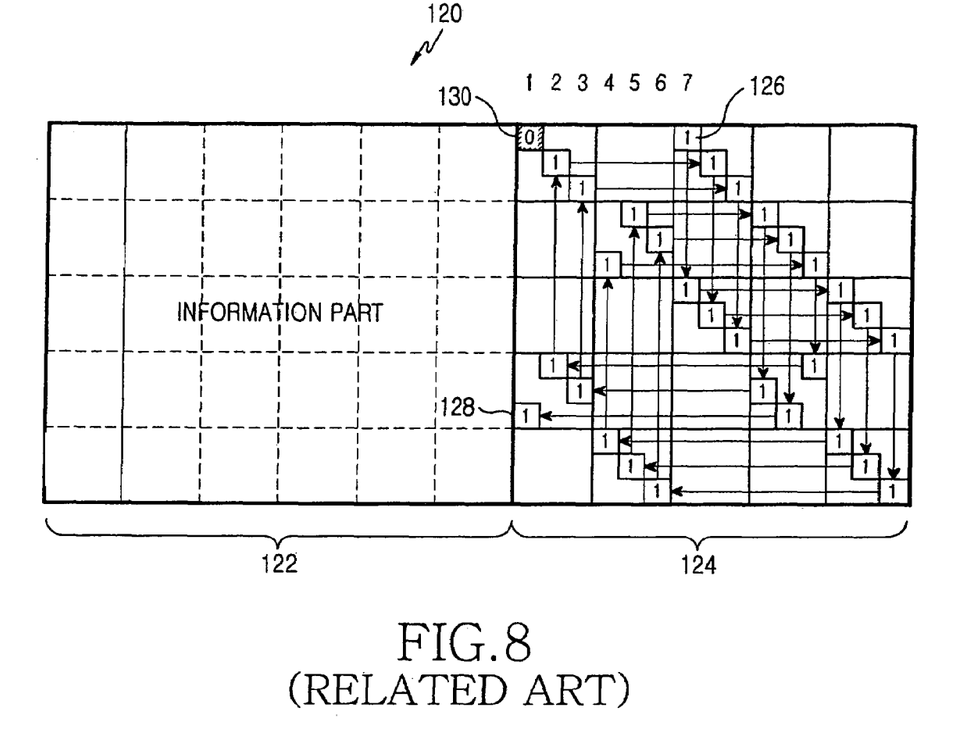
FIG. 8 illustrates a parity check matrix that defines a GDM LDPC code with P=3 and N−K=15, and the associated GDM LDPC coding.

FIG. 8 illustrates a parity check matrix that defines a GDM LDPC code with P=3 and N−K=15. Referring to FIG. 8, a parity check matrix 120 comprises an information part 122 and a parity part 124. The parity part 124 is filled with zero matrices except in subblocks on two diagonals. A first diagonal starts with the subblock in the first subblock row and the first subblock column and ends with the subblock in the last subblock row and the last subblock column. The second diagonal is produced by shifting the first diagonal 2 subblocks and has shifted identity matrices thereon.

When an element 130 in the first row and the first column in the parity part 124 is punctured, the first coded parity bit is obtained from a $7^{th}$ element 126 in the first row according to Eq. (5). The following parity bits are encoded along the arrowed directions, ending with the last parity bit from a $12^{th}$ element 128 of the first column.

However, there exists a column having a degree of '1' in the GDM LDPC code having the configuration illustrated in FIG. 8. The element of '1' in the column is immune to the effects of iterative decoding. In the illustrated case of FIG. 8, the puncturing of the element 130 blocks the element 128 from the effects of the other rows. In this context, a description will now be made of a method of eliminating a coded bit being '1' in a column of degree '1'.

Figure 9:
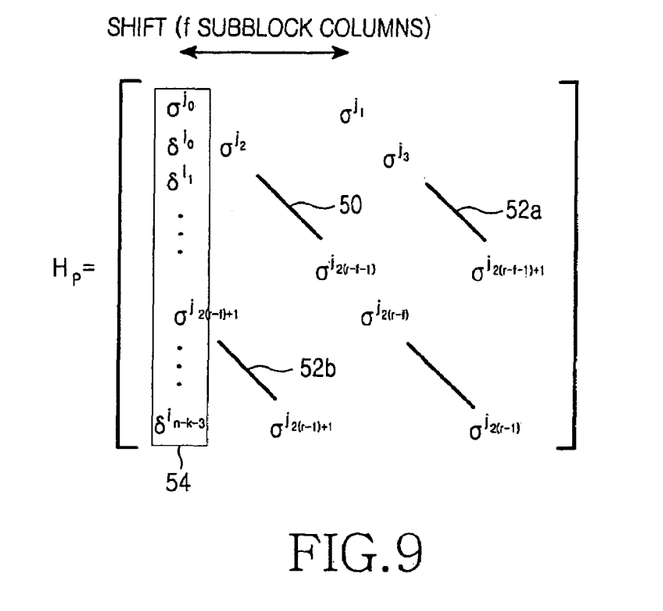
FIG. 9 illustrates the structure of the parity part of a parity check matrix according to an embodiment of the present invention.

FIG. 9 illustrates the structure of the parity part of a parity check matrix according to an embodiment of the present invention. The information part of the parity check matrix is not shown here because it is not related to the subject matter of the present invention.

Referring to FIG. 9, the parity part comprises shifted identity matrices $\sigma^j$ on diagonals 50, 50a and 50b and zero matrices elsewhere. j is an integer between 0 and $2(r-1)$ where r is $(n-k)$. Shifted identity matrices with even shift indexes 0, 2, ..., $2(r-f-1)$, $2(r-f)$, $2(r-1)$ lie on the first diagonal 50. The second diagonals 52a and 52b, which are a shift of the first diagonal 40 by f subblocks, have shifted identity matrices with odd shift indexes 1, 3, ..., $2(r-f-1)+1$, ... $2(r-f)+1$, ... $2(r-1)+1$. The shift indexes of the shifted identity matrices are determined in the manner that maximizes the performance of the LDPC code and simplifies decoder structure. How to determine the shift indexes are beyond the scope of the present invention and will not be described herein.

Particularly, matrices each containing only one element of 1 (hereinafter, referred to as delta matrices $\delta^i$) are inserted into a subblock column 54 including a column of degree 1. The delta matrices $\delta^i$ are of size P×P like the shifted identity matrices and every delta matrix has 1 at an $i^{th}$ bit of the first column. Here, i is an integer between 0 and (P−1) and $\delta^{-1}$ is a zero matrix. A 4×4 $\delta^i$ is $$\delta^i = \begin{bmatrix} 0 & 0 & 0 & 0 \\ 1 & 0 & 0 & 0 \\ 0 & 0 & 0 & 0 \\ 0 & 0 & 0 & 0 \end{bmatrix} \tag{11}$$

Considering that the size of the parity part is (N−K)×(N−K), n=N/P and k=K/P, the subblock column 54 includes (n−k−2) delta matrices. (n−k−2) is an odd number and the positions of the delta matrices are randomly decided.

Summing the rows of the above matrix column by column results in only the element corresponding to the first parity bit is 1 and the other elements are 0s. Hence, as described earlier, the parity bits can be encoded sequentially.

Figure 10:
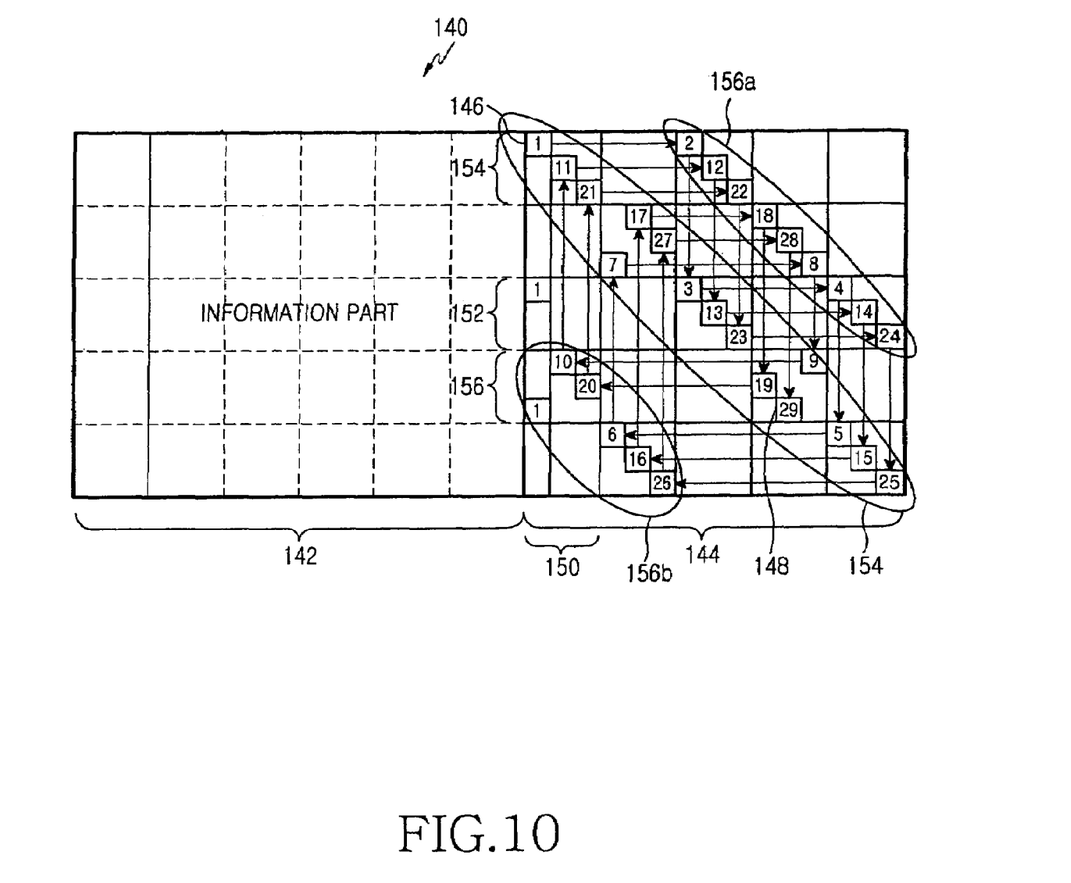
FIG. 10 illustrates a LDPC code and the associated LDPC coding according to an embodiment of the present invention.

FIG. 10 illustrates a LDPC code and the associated LDPC coding according to an embodiment of the present invention. Numerals written in small squares representing elements denote the sequence of encoding parity bits.

Referring to FIG. 10, a parity check matrix 140, H has an information part 142, $H_I$ and a parity part 144, $H_P$ (H=[$H_I$:$H_P$]). Two diagonals 154, 156a and 156b are defined in the parity part 144. A first subblock column 150 of the parity part 144 has two shifted identity matrices 154 and 156 and one delta matrix 152.

As stated before, the vector of the column-by-column sums of the rows in the parity check matrix 140, H is given as S=[$S_I$:$S_P$]. Clearly, $SC^T$=$p_0$+$S_I C_I^T$=0 from $HC^T$=0, and $p_0$ is obtained by the element 146 according to $p_0$=$S_I C_I^T$. $p_1$ is then encoded by $h_0^I C_I^T$+$p_0$+$p_1$=0 and all the other parity bits are encoded in the order indicated by arrows illustrated in FIG. 10. The last parity bit is encoded using the element 148. One thing to be noted is that the parity bits corresponding to the column containing an element of 1 in the delta matrix of the subblock 152 are encoded by considering $p_0$ additionally. Let the parity bits ordered in the coding order be denoted by $p_0'$, $p_1'$, ..., $p_{(N-K-1)}'$ and rows reordered according to the order of $p_t'$ be denoted by $h_t'$. Then, the parity bits are encoded by $$p_{t+1}' = \sum_{i=0}^{t} \left( \hat{h}_t^I C_I^T + p_0' \hat{h}_t^P(0) \right) \tag{12}$$

Figure 11:
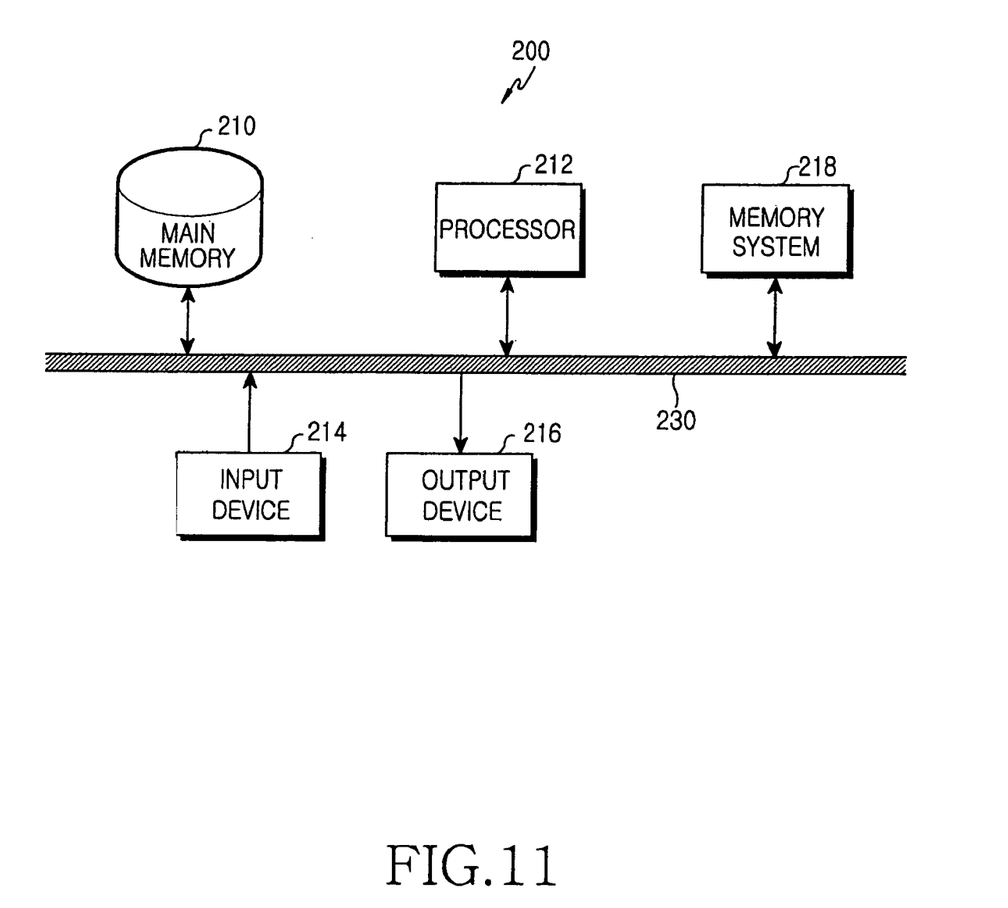
FIG. 11 is a block diagram of an LDPC generating apparatus according to an embodiment of the present invention.

FIG. 11 is a block diagram of a LDPC code generating apparatus according to an embodiment of the present invention.

Referring to FIG. 11, a computer system 200 comprises a processor 212 connected to a memory system 218 via a system bus 230. The processor 212 reads necessary parameters from the memory system 218, generates a LDPC code using the parameters, and stores the LDPC code in the memory system 218. For generation of the LDPC code, the processor 212 may be connected to a main memory 210, an input device 214, and an output device 216 via the system bus 230.

A user enters a command to the processor 212 via the system bus 230 by manipulating the input device 214. The processor 212 operates according to the command signal and displays the operation result to the user via the output device 216. The operation result may be stored in the memory system 218 upon user request.

The LDPC generating operation according to this embodiment of the present invention is implemented by storing known corresponding computer programs codes in the memory system 218 or designing corresponding hardware logic. The parameters needed for generation of the LDPC code or programs codes needed to calculate the parameters are stored in the memory system 218. The LDPC code generated by the processor 212 is stored in the memory system 218 on a subblock-by-subblock basis.

Figure 12:
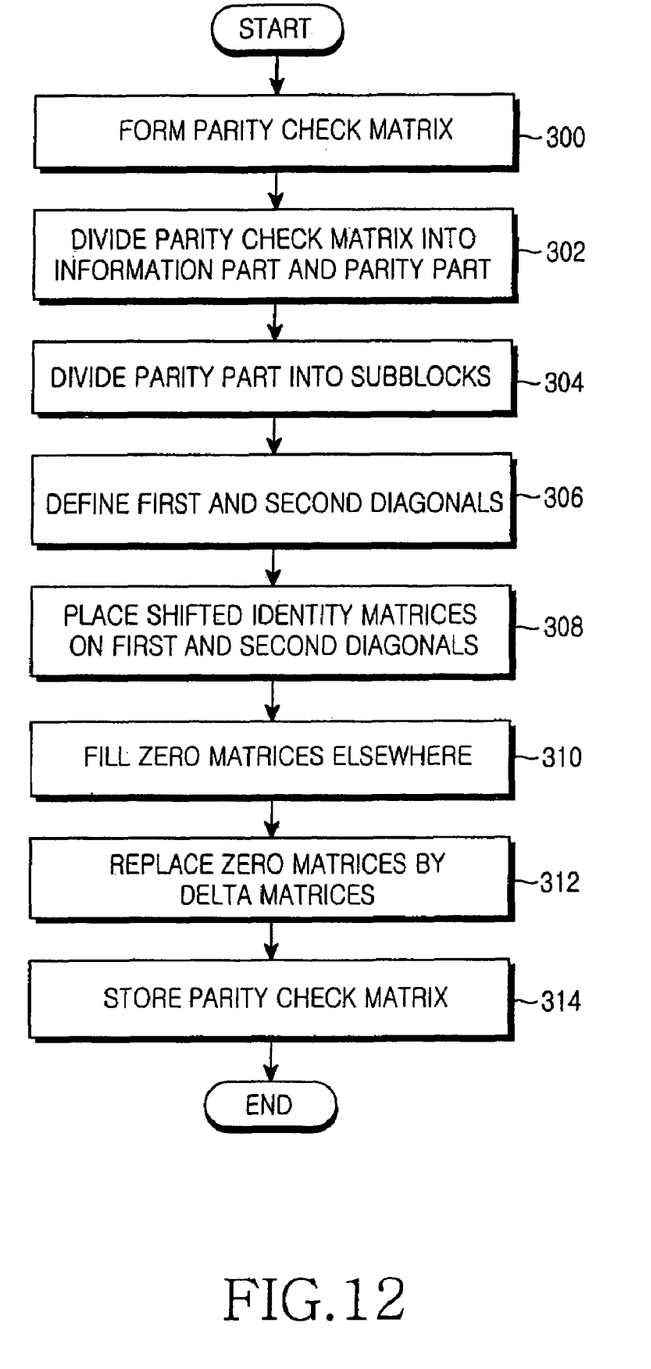
FIG. 12 is a flowchart illustrating an LDPC code generating operation according to an embodiment of the present invention.

FIG. 12 is a flowchart illustrating a LDPC code generating operation according to an embodiment of the present invention. The LDPC code generating operation generates a parity check matrix that defines a LDPC code.

Referring to FIG. 12, a parity check matrix is formed which comprises (N−K) rows for check nodes and N columns for variable nodes in order to encode an information sequence of length K to a codeword of length N in step 300. The parity check matrix is divided into an information part matrix with K columns and a parity part matrix with (N−K) columns in step 302. In step 304, the parity part matrix is further divided into P×P subblocks. P is a divisor of (N−K). Hence, the parity part matrix has (N−K)/P=(n−k) subblock rows and (n−k) subblock columns.

In step 306, first and second diagonals are determined. The first diagonal runs from the first subblock row and subblock column to the last subblock row and subblock column, and the second diagonal is a shift of the first diagonal by f subblocks. Shifted identity matrices with predetermined shift indexes $j_i$ are placed in the subblocks on the first and second diagonals in step 308. f and $j_i$ are determined such that the coding performance of the parity check matrix is maximized. Compared to a conventional GDM LDPC code, none of the elements on the first and second diagonals are punctured.

In step 310, zero matrices are filled elsewhere. An odd number of zero matrices in a subblock column comprising a column of degree 1 are replaced with delta matrices in the parity part matrix in step 312. As described before, the delta matrices are defined as matrices each containing 1 at only one entry and 0s elsewhere. The parity check matrix is stored in the memory system in step 314.

Figure 13:
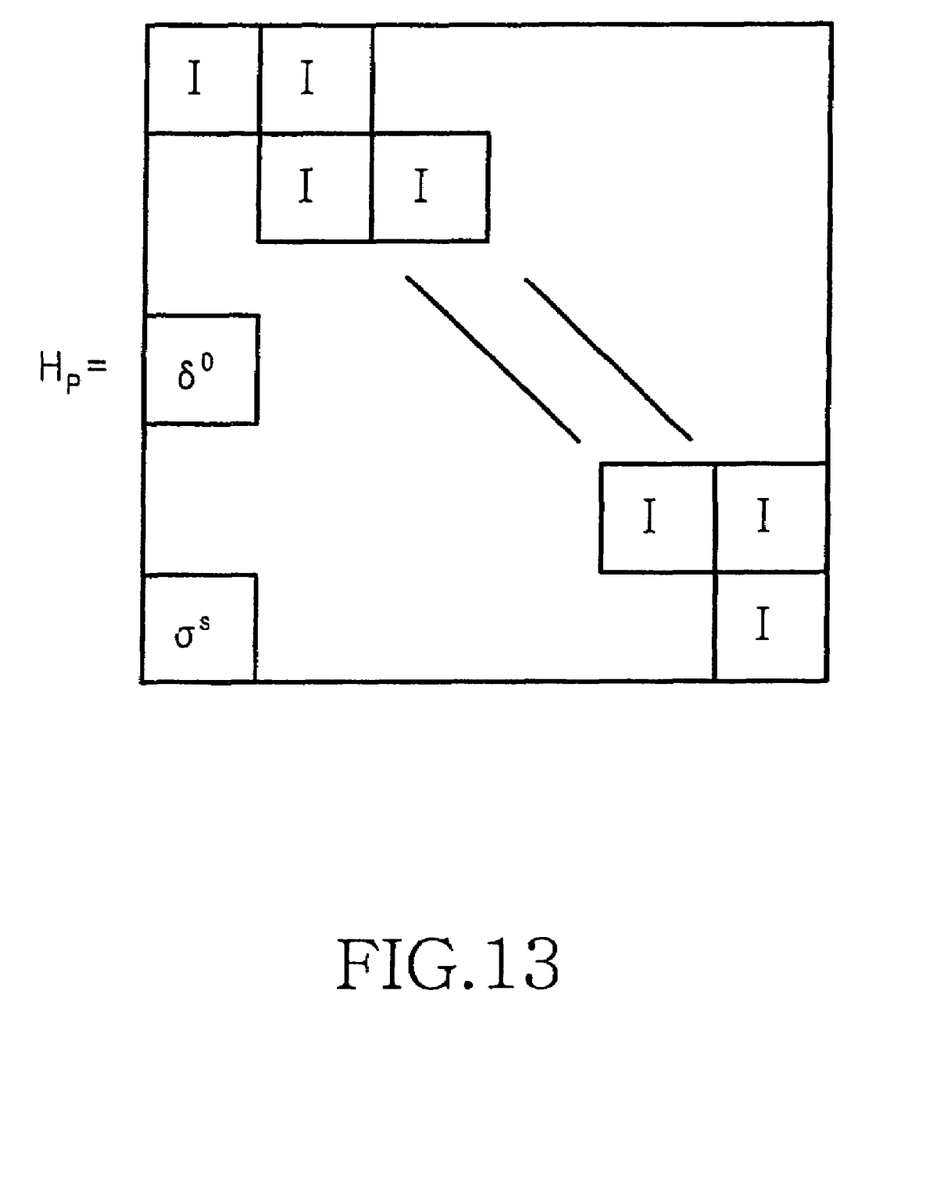
FIG. 13 illustrates an exemplary realization of the parity part of an LDPC code according to an embodiment of the present invention.

FIG. 13 illustrates an exemplary realization of the parity part of an LDPC code according to the preferred embodiment of the present invention.

Referring to FIG. 13, subblocks on dual diagonals are all identity matrices I in a parity part Hp. There are one delta matrix $\delta^0$ and one shifted identity matrix $\delta^s$ in two subblocks of the first subblock column. $\delta^s$ is a matrix shifted from the identity matrix by s. In this manner, insertion of the delta matrix $\delta^0$ in the first subblock column eliminates the column of degree 1, thereby facilitating LDPC coding. Here, s is prime with P denoting a subblock size. This LDPC code offers the benefits of a very simple parity structure and very regular coding of parity bits.

For s=1, the coding order is given as $$P_0 \to P_P \to P_{2P} \ldots \to P_{(n-k-1)P} \to P_1 \to P_{P+1} \ldots \to P_{N-K-1} \quad (13)$$

Figure 14:
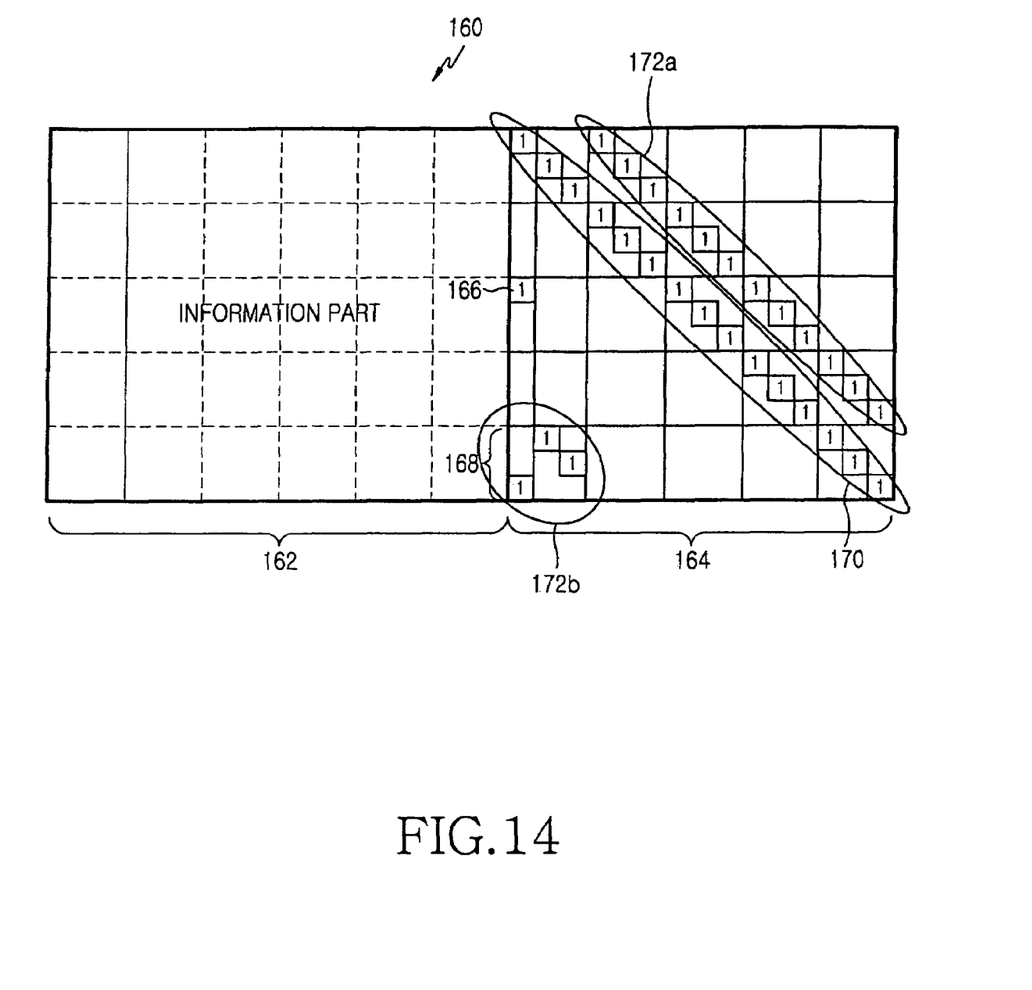
FIG. 14 illustrates a parity check matrix with P=3 according to an embodiment of the present invention.

FIG. 14 illustrates a parity check matrix with P=3 according to an embodiment of the present invention.

Referring to FIG. 14, a parity check matrix 160 has an information part 162 and a parity part 164. In the parity part 164, 3×3 identity matrices are placed on dual diagonals 170, 172a and 172b. The first subblock column comprises a 1-shifted identity matrix 168 and a delta matrix 166 with only one element of 1.

The above-described systematic LDPC code has subblocks of shifted identity matrices and subblocks of delta matrices (i.e. delta blocks). The memory system preserves the parameters needed to represent the block LDPC code, that is, information about the degree of every check node, the degree of every variable node, the positions of non-zero matrices in every row, and the shift index s of every non-zero matrix. These parameters are expressed as positive integers. According to an embodiment of the present invention, the memory system stores the delta blocks discriminately from the other subblocks.

In an embodiment of the present invention, the memory system manages 1-bit subblock information indicating whether each subblock being a non-zero matrix comprises a delta matrix or a shifted identity matrix. s represents a shift index for a subblock with a shifted identity matrix, and s also represents the position of 1 for a subblock with a delta matrix.

In another embodiment of the present invention, the memory system indicates using s whether a subblock being a non-zero matrix includes a delta matrix. Since $0 \leq s < P$, $b=\lceil \log_2 P \rceil$ bits are required to represent s. Here, [ ] is a ceiling function. Accordingly, the memory system allocates as many bits as b or more bits than b to s and represents delta blocks by s being equal to or greater than P.

The parity check matrix is retrieved from the memory system to a LDPC encoder/decoder. The LDPC encoder computes a parity sequence $C_P$ by Eq. (12) using an input information sequence $C_I$ and the parity check matrix and concatenates $C_I$ and $C_P$ into a codeword C. The codeword is transmitted to a receiver through a modulator and a radio frequency (RF) unit.

Figure 15:
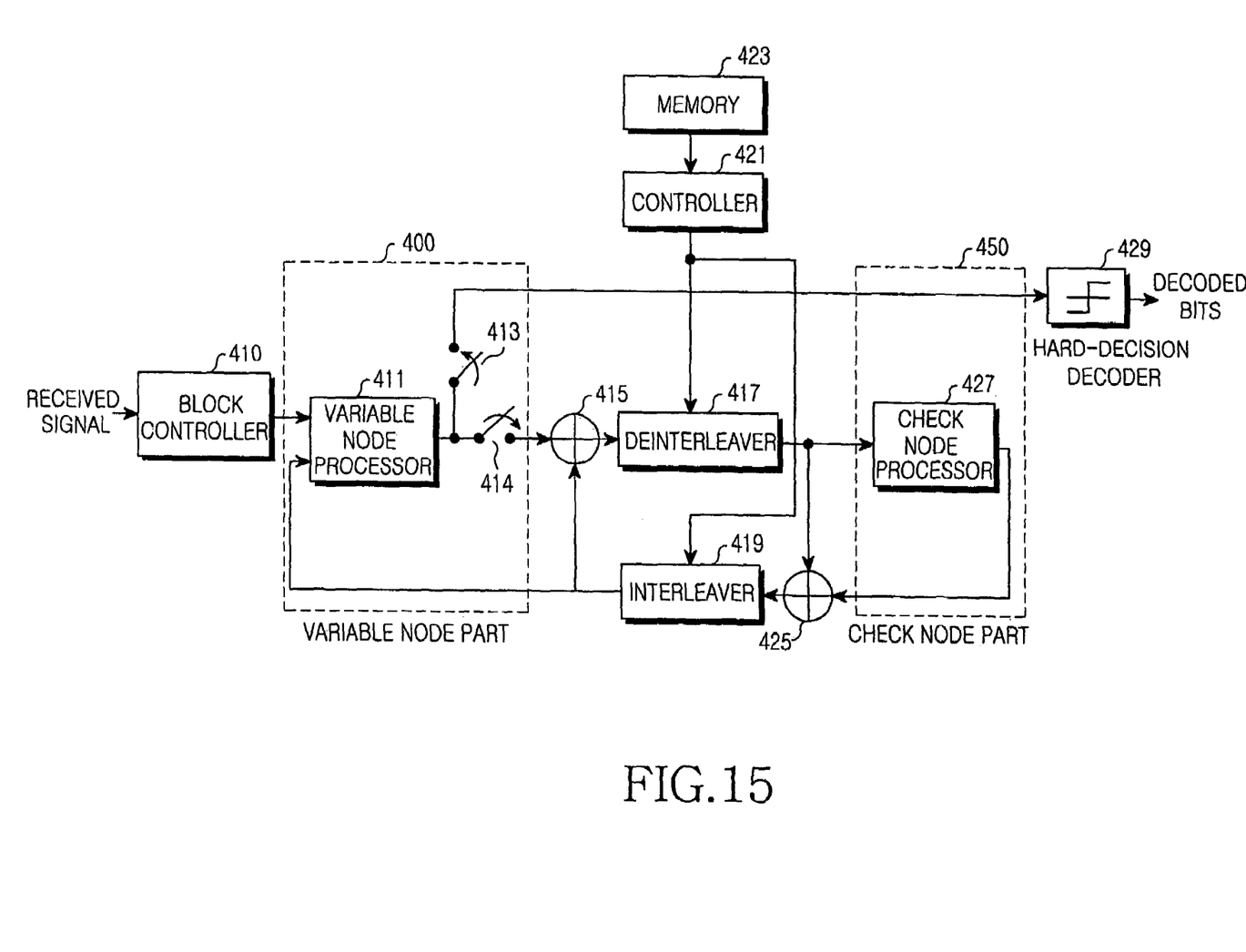
FIG. 15 is a block diagram of a block LDPC decoding apparatus according to an embodiment of the present invention.

With reference to FIG. 15, the configuration of an apparatus for decoding a block LDPC code using a parity check matrix according to a preferred embodiment of the present invention will be described below.

Referring to FIG. 15, the LDPC decoding apparatus comprises a block controller 410, a variable node part 400, an adder 415, a deinterleaver 417, an interleaver 419, a controller 421, a memory 423, an adder 425, a check node part 450, and a hard-decision decoder 429. The variable node part 400 comprises a variable node processor 411 and switches 413 and 414, and the check node part 450 comprises a check node processor 427. The memory 423 represents a parity check matrix using the degree of every check node, the degree of every variable node, the positions of non-zero matrices in every row, and the shift indexes s of the non-zero matrices. The memory 423 may further comprise 1-bit subblock information for indicating whether each subblock being a non-zero matrix comprises a delta matrix or a shifted identity matrix.

In operation, the block controller 410 determines the block size of a signal received on a radio channel. In the presence of an information word part punctured in an LDPC coding apparatus corresponding to the LDPC decoding apparatus, the block controller 410 controls the total block size by inserting 0s in the punctured positions.

The variable node processor 411 calculates the probabilities of the signal received from the block controller 410, and updates existing probabilities with the calculated probabilities. Here, the variable node processor 411 connects the variable nodes to the check nodes in accordance with the predetermined parity check matrix and performs an update operation with as many input values as the number of check nodes connected to every variable node, and a corresponding output value. The number of check nodes connected to every variable node is equal to the weight (i.e. degree) of every column of the parity check matrix, that is, the number of 1s in every column. Thus, the variable node processor 411 operates according to the weight of each column in the parity check matrix. When the switch 413 is disabled, the switch 414 switches the output of the variable node processor 411 to the adder 415.

The adder 415 subtracts the output of the interleaver 419 generated in the previous iteration decoding cycle from the output of the variable node processor 411. In an initial decoding cycle, the interleaver output is considered to be 0.

The deinterleaver 417 deinterleaves the difference signal received from the adder 415 in a predetermined method. The deinterleaver 417 is configured in accordance with the parity check matrix because the interleaver 419 corresponding to the deinterleaver 417 operates in a different manner depending on the positions of elements of 1.

The adder 425 subtracts the output of the check node processor 427 generated in the previous iterative decoding cycle from the output of the deinterleaver 417. The check node processor 427 connects the check nodes to the variable nodes in accordance with the parity check matrix and performs an update operation with as many input values as the number of variable nodes connected to every check node, and a corresponding output value. The number of variable nodes connected to every check node is equal to the weight of every row in the parity check matrix. Therefore, the check node processor 427 operates in accordance with the weight of the rows of the parity check matrix.

The interleaver 419 interleaves the signal received from the adder 425 in a predetermined interleaving method under the control of the controller 421. The controller 421 reads interleaving information from the memory 423 and controls the interleaving operation of the interleaver 419 based on the interleaving information. Obviously, the output of the deinterleaver 417 is considered to be 0 in the initial decoding cycle.

The above decoding operation is iteratively performed. After a predetermined number of decoding iterations, the switch 414 switches off the variable node processor 411 from the adder 415, and the switch 413 switches the variable node processor 411 to the hard-decision decoder 429. The hard-decision decoder 429 performs a hard decision on the signal received from the variable node processor 411 and outputs the hard decision value as final decoded bits.

It can be further contemplated as another embodiment of the present invention that upon completion of variable node processing and check node processing on the signal received from the block controller 410, the switch 413 switches the output of the variable node processor 411 to the hard-decision decoder 429. The hard decision value from the hard-decision decoder 429 is buffered in a buffer (not shown) and a parity checker (not shown) performs a parity check on the hard decision value. The controller 421 may perform the parity check 421. If the parity check fails, the parity checker notifies the controller 421 of a need for further iterative decoding, and thus the signal from the block controller 410 is again subject to variable node processing and check node processing. On the other hand, if the parity check passes, the buffered hard decision value is finally output as decoded bits.

The present invention operating as described above presents the following major effects.

The present invention applies density evolution to coding of all parity bits by avoiding the presence of a variable node of degree 1 for a GDM LDPC code, thereby increasing coding performance. Also, the LDPC code is represented while maintaining its block structure and saving memory capacity. As a result, efficient LDPC coding is carried out.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method of generating a low density parity check (LDPC) code, comprising the steps of:
    (1) forming a parity check matrix having (N−K) rows for check nodes and N columns for variable nodes to encode an information sequence of length K to a codeword of length N;
    (2) dividing the parity check matrix into an information part matrix having K columns and a parity part matrix having (N−k) columns;
    (3) dividing the parity part matrix into P×P subblocks, P being a divisor of (N−K);
    (4) defining a first diagonal and a second diagonal in the parity part matrix, the second diagonal being a shift of the first diagonal by f subblocks;
    (5) placing shifted identity matrices with shift indexes in subblocks that lie on the first and second diagonals;
    (6) filling zero matrices in the remaining subblocks other than the subblocks of the first and second diagonals;
    (7) placing an odd number of delta matrices in one subblock column of the parity part matrix, each delta matrix comprising one element of 1 and the other elements of 0; and
    (8) storing the parity check matrix.

2. The method of claim 1, wherein the step of (4) comprises the step of defining the first diagonal so that the first diagonal starts with a first subblock row and a first subblock column and ends with a last subblock row and a last subblock column.

3. The method of claim 1, wherein the sum module P of the shift indexes of the shifted identity matrices on the first and second diagonals is prime with P.

4. The method of claim 1, wherein the step of (7) comprises the step of substituting one zero matrix in the first subblock column of the parity part matrix into a delta matrix.

5. The method of claim 1, wherein the delta matrices each have one element of 1 in a first column.

6. The method of claim 1, wherein the step of (8) comprises the step of storing information on the degree of each check node, the degree of each variable node, the positions of non-zero matrices in each row, and the shift indexes of each non-zero matrix, the shift index of a non-zero matrix being a delta matrix being equal to or less than P.

7. The method of claim 1, wherein the step of (8) comprises the step of storing information about the degree of each check node, the degree of each variable node, the positions of non-zero matrices in each row, and the shift indexes of each non-zero matrix, and the 1-bit subblock information indicating whether the each non-zero matrix is a delta matrix or not.

8. The method of claim 7, wherein the shift index of a non-zero matrix being a delta matrix indicates the position of an element of 1 in the delta matrix.

9. An apparatus for generating a low density parity check (LDPC) code, comprising:
    a memory system for storing program codes used to generate a parity check matrix defining the LDPC code, and storing the parity check matrix; and
    a processor for generating the parity check matrix by implementing the program codes,
    wherein the processor is adapted to perform the steps of:
    (a) forming a parity check matrix having (N−K) rows for check nodes and N columns for variable nodes to encode an information sequence of length K to a codeword of length N;
    (b) dividing the parity check matrix into an information part matrix having K columns and a parity part matrix having (N−k) columns;
    (c) dividing the parity part matrix into subblocks each being of size P×P where P is a divisor of (N−K);
    (d) defining a first diagonal and a second diagonal in the parity part matrix, the second diagonal being a shift of the first diagonal by f subblocks;
    (e) placing shifted identity matrices with shift indexes in subblocks that lie on the first and second diagonals;
    (f) filling zero matrices in the remaining subblocks other than the subblocks of the first and second diagonals;
    (g) placing an odd number of delta matrices in one subblock column of the parity part matrix, each delta matrix comprising one element of 1 and the other elements of 0; and
    (h) storing the parity check matrix.

10. The apparatus of claim 9, wherein the first diagonal starts with a first subblock row and a first subblock column and ends with a last subblock row and a last subblock column.

11. The apparatus of claim 9, wherein the sum module P of the shift indexes of the shifted identity matrices on the first and second diagonals is prime with P.

12. The apparatus of claim 9, wherein in the step of (g), the processor substitutes one zero matrix in the first subblock column of the parity part matrix into a delta matrix.

13. The apparatus of claim 9, wherein the delta matrices each have one element of 1 in a first column.

14. The apparatus of claim 9, wherein the memory system comprises the parity check matrix using information on the degree of each check node, the degree of each variable node, the positions of non-zero matrices in each row, and the shift indexes of each non-zero matrix, the shift index of a non-zero matrix being a delta matrix being equal to or less than P.

15. The apparatus of claim 9, wherein the memory system comprises the parity check matrix using information on the degree of each check node, the degree of each variable node, the positions of non-zero matrices in each row, and the shift indexes of each non-zero matrix, and the 1-bit subblock information indicating whether the each non-zero matrix is a delta matrix or not.

16. The apparatus of claim 15, wherein the shift index of a non-zero matrix being a delta matrix indicates the position of an element of 1 in the delta matrix.

17. A low density parity check (LDPC) coding method comprising the steps of:

receiving an information sequence;

encoding an information sequence of length K to a codeword of length N using an (N, K) parity check matrix having an information part matrix with (N−K) rows and K columns and a parity part matrix with K rows and K columns; and transmitting the codeword to a receiver, wherein the parity check matrix is a set of subblocks and comprises a matrix having one element of 1 in at least one of the subblocks and no columns of degree 1 exist in the parity check matrix.

* * * * *